(12) United States Patent
Wu

(10) Patent No.: US 7,596,030 B2
(45) Date of Patent: Sep. 29, 2009

(54) METHOD FOR IMPROVING MEMORY DEVICE CYCLING ENDURANCE BY PROVIDING ADDITIONAL PULSE

(75) Inventor: Chao-I Wu, Tainan (TW)

(73) Assignee: Macronix International Co., Ltd. (TW)

( * ) Notice: Subject to any disclaimer, the term of this patent is extended or adjusted under 35 U.S.C. 154(b) by 90 days.

(21) Appl. No.: 11/461,506

(22) Filed: Aug. 1, 2006

(65) Prior Publication Data
US 2008/0031053 A1    Feb. 7, 2008

(51) Int. Cl.
*G11C 16/04* (2006.01)
(52) U.S. Cl. .............................. 365/185.19; 365/185.28
(58) Field of Classification Search ............. 365/185.19
See application file for complete search history.

(56) References Cited

U.S. PATENT DOCUMENTS

| | | | |
|---|---|---|---|
| 5,388,069 A | 2/1995 | Kokubo | |
| 6,011,725 A | 1/2000 | Eitan | |
| 6,219,276 B1 | 4/2001 | Parker | |
| 6,320,786 B1 | 11/2001 | Chang et al. | |
| 6,396,741 B1 | 5/2002 | Bloom et al. | |
| 6,768,165 B1 | 7/2004 | Eitan | |
| 6,914,819 B2 | 7/2005 | Yeh et al. | |
| 7,015,101 B2 | 3/2006 | Zheng et al. | |
| 7,031,196 B2 | 4/2006 | Yeh et al. | |
| 7,038,928 B1 | 5/2006 | Hsu et al. | |
| 7,209,390 B2* | 4/2007 | Lue et al. | 365/185.19 |
| 2007/0247923 A1* | 10/2007 | Ding et al. | 365/185.29 |

OTHER PUBLICATIONS

Kuo-Hong Wu et al., Phenomenal SONOS Performance for Next-Generation Flash Memories.
Paolo Pavan, et al., Flash Memory Cells—An Overview, Proceedings of the IEEE, vol. 85, No. 8, Aug. 1997.
CC Yeh, et al., Phines: A Novel Low Power Program/Erase, Small Pitch, 2-Bit per Cell Flash Memory, IEEE 2002.
Jau-Yi Wu, et al., A Single-Sided Phines Sonos Memory Featuring High-Speed and Low-Power Applications, IEEE 2006.

* cited by examiner

*Primary Examiner*—Hoai V Ho
*Assistant Examiner*—Jason Lappas
(74) *Attorney, Agent, or Firm*—Baker & McKenzie LLP

(57) ABSTRACT

A method for improving the cycle endurance of a memory device during a memory cell programming operation includes applying a first negative bias pulse measured from a gate to a drain of the memory device at a level sufficient to induce hot hole injection into a nitride region of the gate adjacent to the drain, and applying a second negative bias pulse measured from the gate to the drain on the memory device, wherein the magnitude of the second negative bias pulse is less than the magnitude of the first negative bias pulse, and the duration of the second negative bias pulse is less than the duration of the first negative bias pulse.

25 Claims, 9 Drawing Sheets

Figure 2
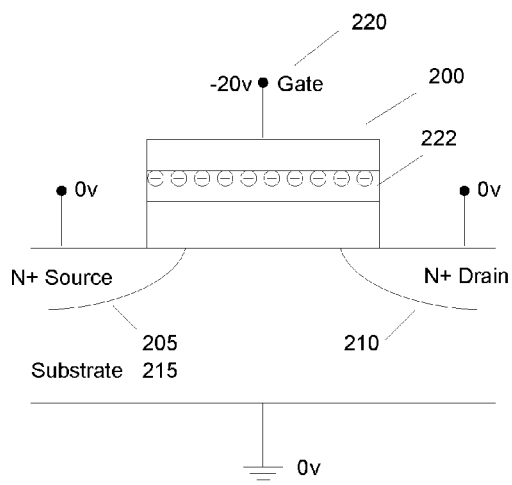
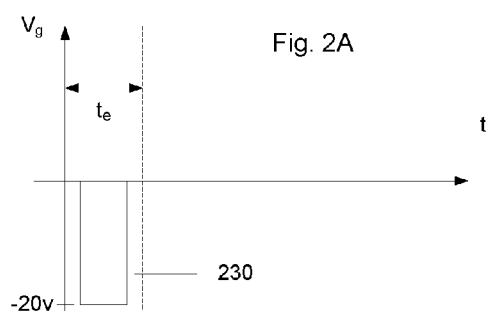
Fig. 2A
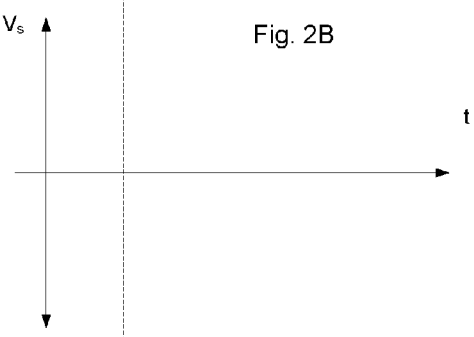
Fig. 2B
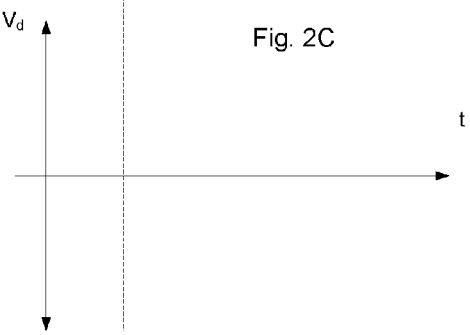
Fig. 2C

Figure 3
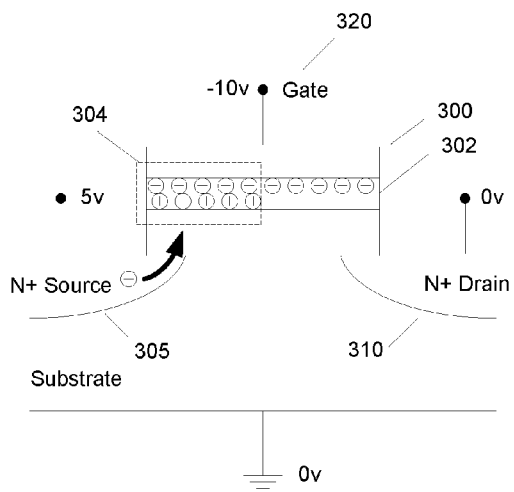
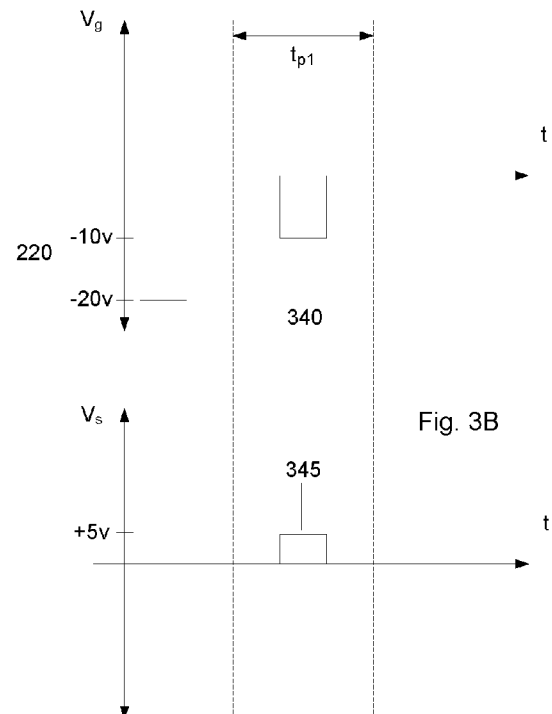
Fig. 3A
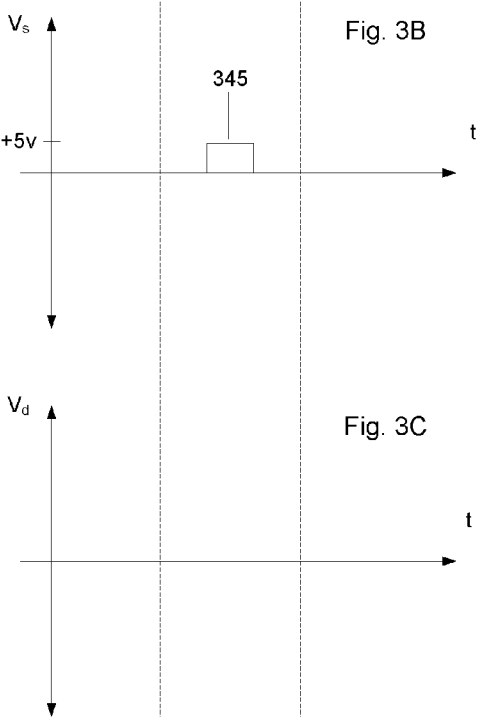
Fig. 3B
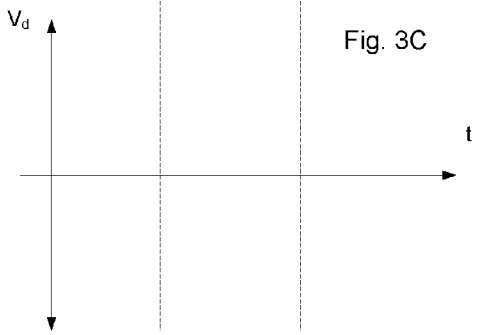
Fig. 3C

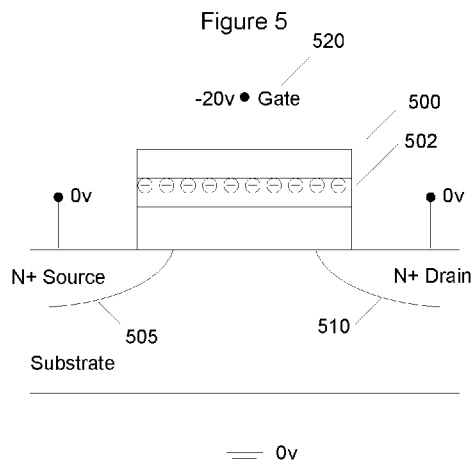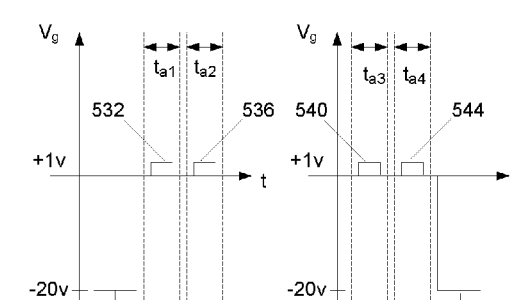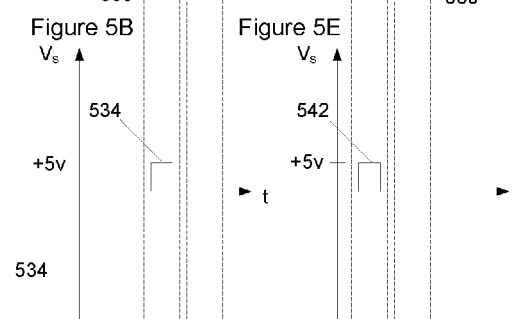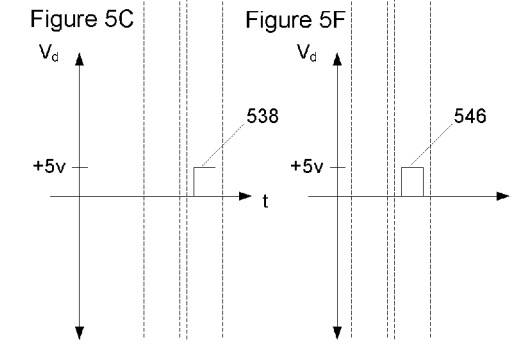

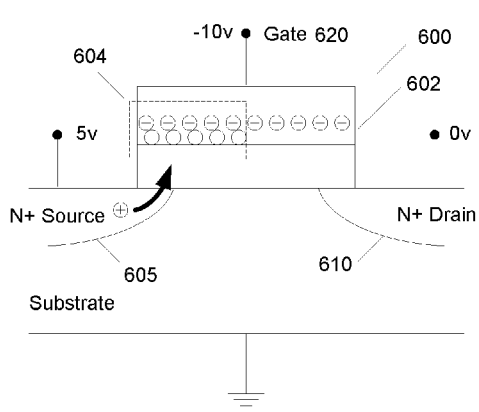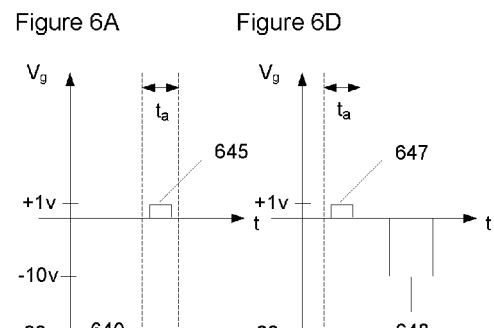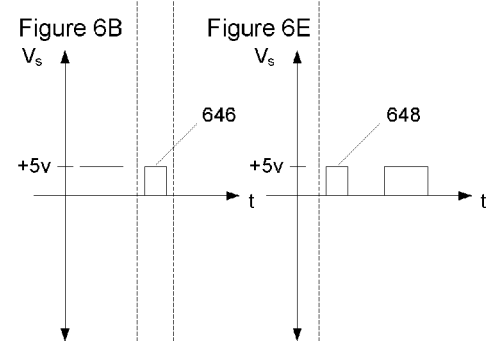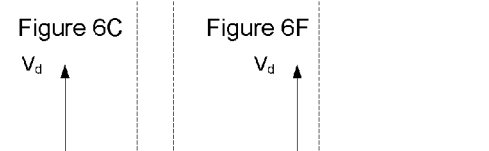

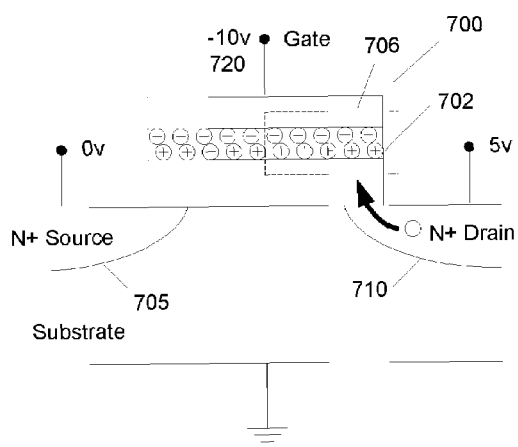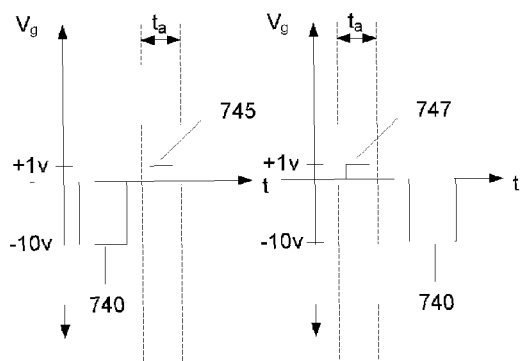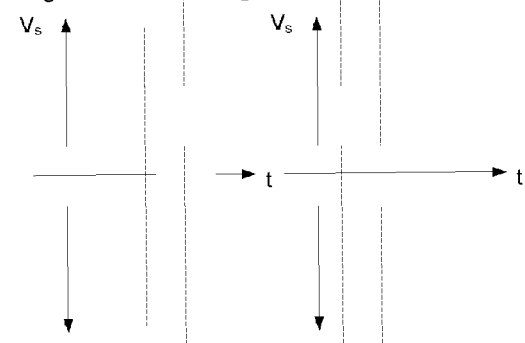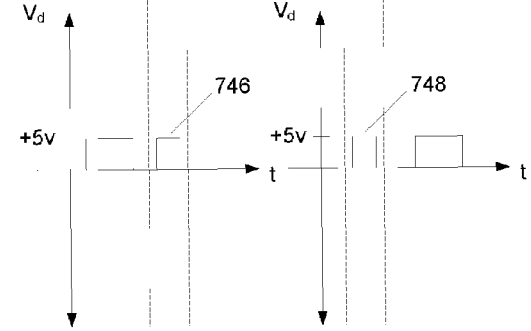

METHOD FOR IMPROVING MEMORY DEVICE CYCLING ENDURANCE BY PROVIDING ADDITIONAL PULSE

BACKGROUND

1. Field of the Invention

The field of this application relates to PHINES memory devices, and more particularly, to a novel technique for programming and erasing such devices so as to improve their cycling endurance.

2. Background of the Invention

Memory devices for non-volatile storage of information are in wide use. Examples of such memory devices include read only memory (ROM), programmable ROM (PROM), erasable programmable ROM (EPROM), electrically erasable programmable ROM (EEPROM), and flash EEPROM. A flash memory generally refers to a flash EEPROM, which may be erased in blocks of data instead of one byte at a time. Flash memory is popular in devices that require storage of large amounts of data, such as digital cameras and MP3 players. Most flash memory is based upon conventional "floating gate" memory devices.

Conventional "floating gate" flash memory devices have certain disadvantages, such as high power consumption, program and read disturbances, manufacturing complexity, and non-shrinkable architectures. To address some of these concerns, a novel flash memory device named PHINES (Programming by hot Hole Injection Nitride Electron Storage) has been developed. An article describing the PHINES memory device is C.C. Yeh, et. al., PHINES: A Novel Low Power Program/Erase, Small Pitch, 2-Bit per Cell Flash Memory, Int'l Electron Dev. Mtg., Dec. 8-11, 2002, pp. 931-34, which is hereby incorporated by reference into the specification of this application. The PHINES device is based upon a silicon-oxide-nitride-oxide-silicon (SONOS) charge trapping region rather than a floating gate arrangement.

One disadvantage associated with conventional PHINES memory devices is the cycling endurance of the device. As conventional PHINES memory devices are cycled through numerous program and erase cycles, the hot hole injection process appears to degrade the oxide region in the gate, thereby weakening the threshold voltages of the memory device. The degradation in the threshold voltage becomes a measurable effect as the number of program/erase cycles on the memory device increases.

SUMMARY

The cycling endurance of a memory device, such as a PHINES memory device, can be improved by providing additional pulses that are associated with the program and erase pulses on the memory device. These additional pulses can be provided before or after the conventional program and erase pulses. In one aspect, two additional pulses can be associated with a conventional erase pulse that is applied to a PHINES memory device. These first and second additional pulses can be provided any order (meaning that the second additional pulse may precede the first additional pulse) and can be provided either before the erase pulse, or after the erase pulse. These additional pulses prevent at least some of the damage that occurs in the oxide regions of the gate during the erase process, which improves endurance over many cycles.

According to another aspect, additional pulses can be associated with a conventional program pulses that are applied to a PHINES memory device. For example, when a source-side of a PHINES memory device is programmed with a program pulse, an additional pulse will be applied to the source-side of the PHINES memory device. Similarly, when a drain-side of a PHINES memory device is programmed with a program pulse, an additional pulse will be applied to the drain-side of the memory device. These additional pulses can be provided either before or after the program pulse. Further, the order of the program pulses (i.e., drain-program before source-program, and vice versa) is immaterial. Much like the additional pulses associated with the erase pulse, these additional pulses appear to have the benefit of preventing at least some of the damage that occurs in the oxide regions of the gate during the program (i.e., hot hole injection) process.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 2 is a schematic diagram illustrating a cross-sectional view of a conventional PHINES memory device receiving an erase pulse;

FIGS. 2A-2C are timing diagrams depicting the timing of the biases applied to the gate, drain, and source of the PHINES memory device during an erase pulse;

FIG. 3 is a schematic diagram illustrating a cross-sectional view of a conventional PHINES memory device receiving a program pulse at the source side;

FIGS. 3A-3C are timing diagrams depicting the timing of the biases applied to the gate, drain, and source of the PHINES memory device during a program pulse at the source side;

FIG. 5 is a schematic diagram illustrating a cross-sectional view of a conventional PHINES memory device receiving an improved erase pulse;

FIGS. 5A-5C are timing diagrams depicting the timing of the biases applied to the gate, drain, and source of the PHINES memory device during an improved erase pulse in which additional pulses are provided after the erase pulse;

FIGS. 5D-5F are timing diagrams depicting the timing of the biases applied to the gate, drain, and source of the PHINES memory device during an improved erase pulse in which additional pulses are provided before the erase pulse;

FIG. 6 is a schematic diagram illustrating a cross-sectional view of a conventional PHINES memory device receiving an improved program pulse at the source side;

FIGS. 6A-6C are timing diagrams depicting the timing of the biases applied to the gate, drain, and source of the PHINES memory device during an improved program pulse at the source side in which an additional pulse is provided after the program pulse;

FIGS. 6D-6F are timing diagrams depicting the timing of the biases applied to the gate, drain, and source of the PHINES memory device during an improved program pulse at the source side in which an additional pulse is provided before the program pulse;

FIG. 7 is a schematic diagram illustrating a cross-sectional view of a conventional PHINES memory device receiving an improved program pulse at the drain side;

FIGS. 7A-7C are timing diagrams depicting the timing of the biases applied to the gate, drain, and source of the PHINES memory device during an improved program pulse at the drain side in which an additional pulse is provided after the program pulse;

FIGS. 7D-7F are timing diagrams depicting the timing of the biases applied to the gate, drain, and source of the PHINES memory device during an improved program pulse at the drain side in which an additional pulse is provided before the program pulse;

DETAILED DESCRIPTION

Figure 1:
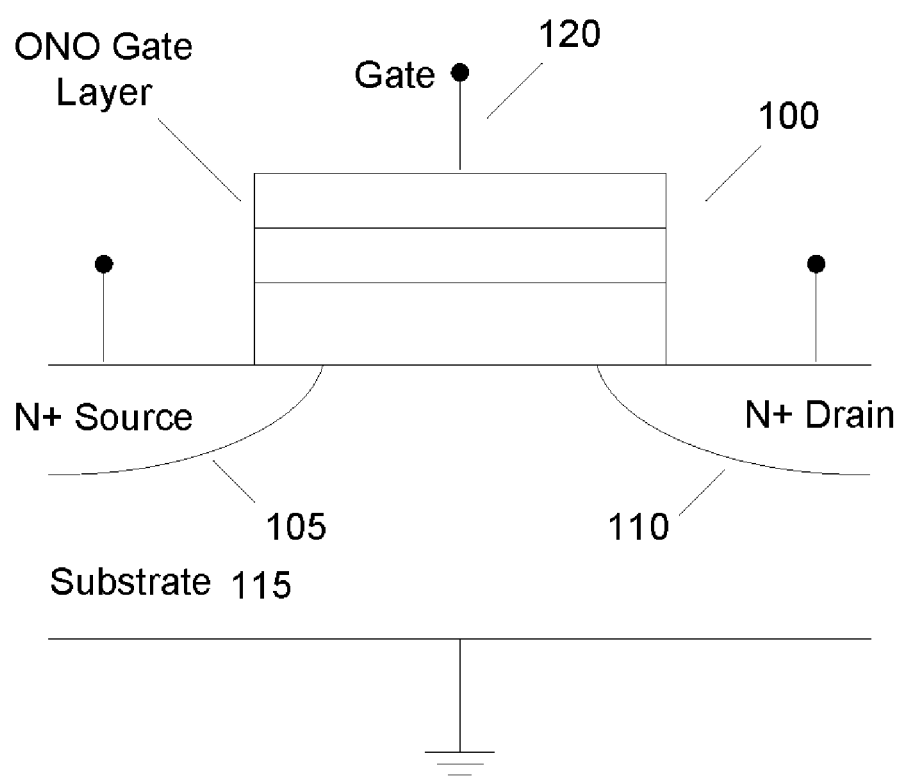
FIG. 1 is a schematic diagram illustrating a cross-sectional view of a conventional PHINES memory device.

A representative PHINES device is depicted in FIG. 1. In FIG. 1, the memory device 100 comprises a buried source 105 and a buried drain 110 formed in a substrate 115. Also shown in FIG. 1 is a gate region 120 comprised of an oxide-nitride-oxide (ONO) layer. In operation, the nitride layer in the gate 120 acts as a charge-trapping region that can store both holes and electrons so as to indicate either a programmed or un-programmed state of the memory device 100. The structure formation and operation of the PHINES memory device 100 depicted in FIG. 1 is described in more detail in the article Jau-Yi Wu, et al., A Single-Sided PHINES Memory Featuring High-Speed and Low-Power Applications, IEEE Electron Device Letters, vol. 27, no. 2, February 2006, which is hereby incorporated by reference into the specification of this application.

The process by which a PHINES memory device 200 is erased is depicted in FIG. 2. In FIGS. 2-7, similar reference numbers were used to refer to similar features. In FIG. 2, the memory device 200 is erased by applying a negative bias on the gate 220 at a level sufficient to induce Fowler-Nordheim tunneling into a nitride region 222 of the gate. The source 205, drain 210, and substrate 215 regions of the memory device 200 are maintained at 0 volts bias during the erase pulse. The timing diagrams corresponding to the biases applied to the gate, source, and drain regions are depicted in FIGS. 2A, 2B, and 2C, respectively. In FIG. 2A, an erase pulse is provided to gate 220 during the time period $t_e$. According to one embodiment, the erase pulse comprises a –20 volt pulse 230 that is applied to the gate region of the memory device 200. Other acceptable biases for the erase pulse include the range from 14 volts to 20 volts (or –14 volts to –20 volts). Further, the erase pulse may last anywhere in the rage of 1 ms to 100 ms. At the same time $t_e$ that the erase pulse 230 is being provided, the voltage bias applied to the source and drain regions is maintained at 0 volts, as shown in FIGS. 2B and 2C, respectively. By trapping a significant amount of charge in the nitride region 222 of the gate 200, the threshold voltage $v_t$ is effectively raised by several volts. Raising this threshold voltage $v_t$ effectively places the memory device 200 in an unprogrammed state.

The process by which a source side of the memory device 300 can be programmed is depicted in FIG. 3. In FIG. 3, a first region 304 of the memory device 300 is programmed by applying a first program pulse. The first program pulse is created by applying a bias voltage to gate 320 and source 305. The net effect of these bias voltages is a negative bias measured from the gate 320 to the source 305 at a level sufficient to induce hot hole injection into the nitride region 302 lying within the first area 304. As shown in FIG. 3, the first program pulse may comprise a negative bias of –10 volts applied to the gate 320 and a positive bias of 5 volts applied to the source 305. Other acceptable biases for the first program pulse include the following ranges: $V_g$ from –3 volts to –10 volts and $V_s$ from 4 volts to 6 volts. The time period for this first program pulse can be anywhere in the range of 10 µs to 10 ms. The drain 310 is maintained at 0 volts during the application of the first program pulse. The positive voltage applied to source 305 will create minority carriers in source 305 near gate 320. The negative bias on gate 320 will then induce these minority carriers to inject into area 304 via induced not while injecting.

The timing diagrams corresponding to the biases applied to the gate 320, source 305 and drain 310 regions of the memory device 300 during the first program pulse are depicted in FIGS. 3A, 3B and 3C, respectively. As shown in these figures, the first program pulse is applied during the time period $t_{p1}$. FIG. 3A demonstrates that a negative bias 340 is applied to the gate 320 during time period $t_{p1}$ and FIG. 3B demonstrates that a positive bias 345 is applied to the source 305 at the same time. FIG. 3C demonstrates that the drain 310 is held at 0 v bias during the period of the first program pulse $t_{p1}$. Importantly, however, none of these biases are sufficient to "turn on" the channel of the device.

Figure 4:
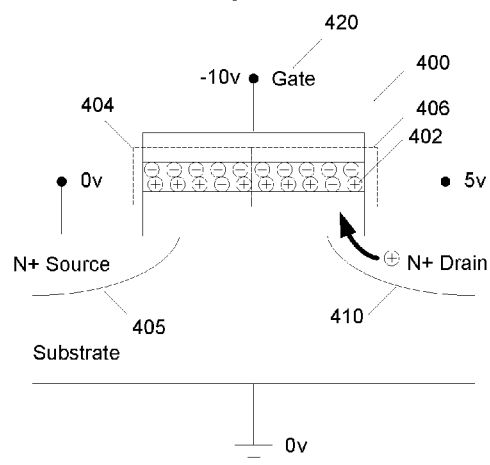
FIG. 4 is a schematic diagram illustrating a cross-sectional view of a conventional PHINES memory device receiving a program pulse at the drain side.

The process by which a drain side of the memory device 300 can be programmed is depicted in FIG. 4. In FIG. 4, a second region 406 of the memory device 400 is programmed by applying a second program pulse. The second program pulse comprises a negative bias measured from the gate 420 to the drain 410 at a level sufficient to induce hot hole injection into the nitride region 402 lying within the second region 406. As shown in FIG. 4, the second program pulse may comprise a negative bias of –10 volts applied to the gate 420 and a positive bias of 5 volts applied to the drain 410. Other acceptable biases for the first program pulse include the following ranges: $V_g$ from –3 volts to –10 volts and $V_d$ from 4 volts to 6 volts. The time period for this first program pulse can be anywhere in the range of 10 µs to 10 ms. The source 405 is maintained at 0 volts during the application of the second program pulse.

Figure 4A:
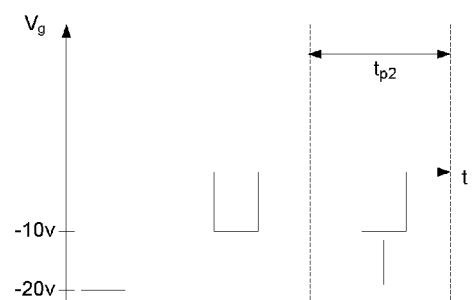
FIGS. 4A-4C are timing diagrams depicting the timing of the biases applied to the gate, drain, and source of the PHINES memory device during a program pulse at the drain side.
Figure 4B:
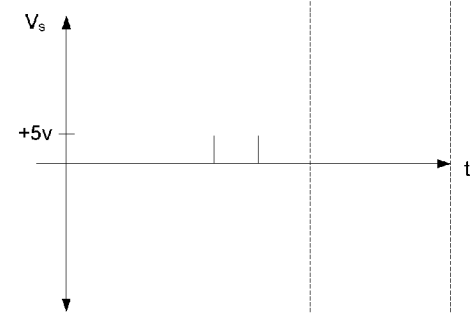
Figure 4C:
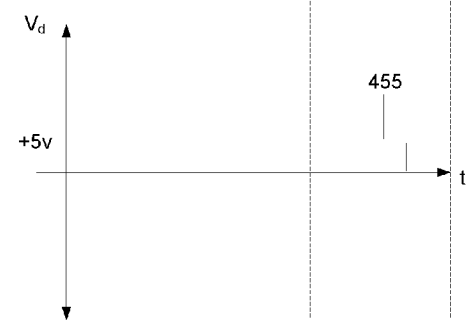

The timing diagrams corresponding to the biases applied to the gate 420, source 405 and drain 410 regions of the memory device 400 during the second program pulse are depicted in FIGS. 4A, 4B and 4C, respectively. As shown in these figures, the second program pulse is applied during the time period $t_{p2}$. FIG. 4A demonstrates that a negative bias 450 is applied to the gate 420 during time period $t_{p2}$ and FIG. 4B demonstrates that a positive bias 455 is applied to the drain 410 at the same time. FIG. 4C demonstrates that the source 405 is held at 0 v bias during the period of the second program pulse $t_{p2}$.

A method for providing an erase pulse to a PHINES memory device 500 in accordance without embodiment is depicted in FIGS. 5-5F. In FIG. 5, an erase pulse is being applied to a PHINES memory device 500 by providing a negative bias to the gate 520 at a level sufficient to induce electron tunneling into a nitride region 502 of the gate 520. In FIG. 5, the magnitude of the erase pulse is negative 20 volts; however, erase pulses of other magnitudes can be applied, depending upon the device characteristics, power constraints, or time constraints in programming the device. The cycle endurance of the memory device 500 can be improved by utilizing additional pulses that are applied to the gate, drain, and source of the memory device 500. These additional pulses can either be provided after an erase pulse occurs (as depicted in FIGS. 5A-5C) or prior to the application of an erase pulse (as depicted in FIGS. 5D-5F). These additional pulses comprise a negative bias as measured from the gate 520 to the source 505 and drain 510 regions of the memory device 500. The magnitude of these additional pulses is less than the magnitude of both the erase pulse and the program pulse.

As shown in FIGS. 5A-5C, the first and second additional pulses can be provided after the erase pulse 530. The first erase pulse is provided during time period $t_{a1}$ and the second additional pulse is provided during time period $t_{a2}$. According to one embodiment, the first additional pulse may comprise a small positive bias 532 applied to the gate 520, such as about 1 volt, while applying a larger bias 534 to the source 505, such as 5 volts. Providing these biases produces a net negative bias measured from the gate 520 to the source 505 on the memory device 500. The magnitude of this first additional pulse is less than the magnitude of the erase pulse 530. Acceptable biases for the first additional pulse include the ranges of $V_g$ from 0 volts to 3 volts and $V_s$ from 4 volts to 6 volts. Further, the duration of the first additional pulse can range anywhere from 10 μs to 1 ms. Also shown in FIGS. 5A-5C is a second additional pulse that occurs during time period $t_{a2}$. According to one embodiment, the second additional pulse may comprise a negative bias, as measured from the gate 520 to the drain 510 on the memory device 500. This second additional pulse may take the form of a small positive bias 536 applied to the gate region, such as 1 volt, coupled with a larger positive bias 538 applied to the drain 510, such as 5 volts, thereby producing a net negative bias measured from the gate 520 to the drain 510 on the memory device 500. Acceptable biases for the second additional pulse include the ranges of $V_g$ from 0 volts to 3 volts and $V_d$ from 4 volts to 6 volts. Further, the duration of the second additional pulse can range anywhere from 10 μs to 1 ms. The first and second additional pulses can be provided in any order; meaning that the second additional pulse can precede the first additional pulse without departing from the scope of this invention.

An alternative technique for providing the first and second additional pulses is depicted in FIGS. 5D-5F. In FIGS. 5D-5F, the first and second additional pulses are provided before the erase pulse 530. The first erase pulse is provided during time period $t_{a3}$ and the second additional pulse is provided during time period $t_{a4}$. According to one embodiment, the first additional pulse may comprise a small positive bias 540 applied to the gate 520, such as about 1 volt, while applying a larger bias 542 to the source 505, such as 5 volts. Acceptable biases for the first additional pulse include the ranges of $V_g$ from 0 volts to 3 volts and $V_s$ from 4 volts to 6 volts. Further, the duration of the first additional pulse can range anywhere from 10 μs to 1 ms. Providing these biases produces a net negative bias measured from the gate 520 to the source 505 on the memory device 500. The magnitude of this first additional pulse is less than the magnitude of both the erase pulse 530 and the program pulse. Also shown in FIGS. 5D-5F is a second additional pulse that occurs during time period $t_{a2}$. According to one embodiment, the second additional pulse may comprise a negative bias, as measured from the gate 520 to the drain 510 on the memory device 500. This second additional pulse may take the form of a small positive bias 544 applied to the gate region, such as 1 volt, coupled with a larger positive bias 546 applied to the drain 510, such as 5 volts, thereby producing a negative bias measured from the gate 520 to the drain 510 on the memory device 500. Acceptable biases for the second additional pulse include the ranges of $V_g$ from 0 volts to 3 volts and $V_d$ from 4 volts to 6 volts. Further, the duration of the first additional pulse can range anywhere from 10 μs to 1 ms. The first and second additional pulses can be provided in any order; meaning that the second additional pulse can precede the first additional pulse without departing from the scope of this invention.

A method for providing a first program pulse to a PHINES memory device 600 in accordance with one embodiment is depicted in FIGS. 6-6F. In FIG. 6, a first program pulse is being applied to the source region 604 of a PHINES memory device 600 by providing a net negative bias measured from the gate 620 to the source 605 at a level sufficient to induce hot hole injection into a nitride region 602 of the gate 620. In the embodiment depicted in FIG. 6, the first program pulse comprises a −10 v bias applied to the gate region 620 coupled with a +5 v bias applied to the source region 605. This produces a net negative bias of −15 v as measured from the gate 620 to the source 605. The drain region 610 of the memory device is held at 0 v potential during the first program pulse. The program pulse can be modified to suit the device characteristics, the power constraints, or the time constraints in programming the device. It is desirable, however, for the channel of the memory device 600 to remain off during the program pulse, regardless of the specific configuration of the memory device 600.

The cycle endurance of the memory device 600 can be improved by utilizing an additional pulse that is applied to the gate and source regions the memory device 500 with the program pulse. This additional pulse can either be provided after the program pulse occurs (as depicted in FIGS. 6A-6C), or prior to the application of a program pulse (as depicted in FIGS. 6D-6F). These additional pulses comprise a net negative bias as measured from the gate region 620 to the source region 605 of the memory device 600. But the magnitude of this additional pulse (e.g., −4 v) will generally be less than the magnitude of the program pulse (e.g., −15 v).

As shown in FIGS. 6A-6C, the additional pulse can be provided after the first program pulse 640. The additional pulse is provided during time period $t_a$ and generally lasts for a period of 10 μs to 1 ms. According to one embodiment, the additional pulse may comprise a small positive bias 645 applied to the gate 620, such as about 1 volt, while applying a larger bias to the source 605, such as about 5 volts. Acceptable biases for the additional pulse include the ranges of $V_g$ from 0 volts to 3 volts and $V_s$ and $V_d$ from 4 volts to 6 volts. Further, the duration of these additional pulses can range anywhere from 10 μs to 1 ms. Providing these biases produces a net negative bias measured from the gate 620 to the source 605 on the memory device 600.

An alternative technique for providing the additional pulse is depicted in FIGS. 6D-6F. In FIGS. 6D-6F, the additional pulse is provided before the first program pulse 640. The additional pulse is provided during time period $t_a$ and lasts for a period of about 10 μs to 1 ms. According to one embodiment, the first additional pulse may comprise a small positive bias 647 applied to the gate 620, such as about 1 volt, while applying a larger bias 648 to the source 605, such as about 5 volts. Acceptable biases for the first additional pulse include the ranges of $V_g$ from 0 volts to 3 volts and $V_s$ from 4 volts to 6 volts. Further, the duration of the first additional pulse can range anywhere from 10 μs to 1 ms. Providing these biases produces a net negative bias measured from the gate 620 to the source 605 on the memory device 600. The magnitude of this additional pulse is less than the magnitude of the program pulse 640. As mentioned previously, the additional pulse can be provided either before or after the program pulse 640 without departing from the scope of this invention.

An improved method for providing a second program pulse to a PHINES memory device 700 is depicted in FIGS. 7-7F. In FIG. 7, a second program pulse is being applied to a region 706 adjacent to the drain of a PHINES memory device 700 by providing a net negative bias measured from the gate 720 to the drain 710 at a level sufficient to induce hot hole injection into a nitride region 702 of the gate 720. In the embodiment depicted in FIG. 7, the second program pulse comprises a −10 v bias applied to the gate region 720 coupled with a +5 v bias applied to the drain region 710. The source region 705 of the memory device is held at 0 v bias. Although the second program pulse can be implemented with other voltages and biases, it is desirable for the channel of the memory device 700 to remain off during the program pulse. A variety of program pulses can be utilized with this memory device depending upon the device characteristics, power constraints, or time constraints in programming the device.

The cycle endurance of the memory device 700 can be improved by utilizing an additional pulse that is applied to the gate and drain regions the memory device 700 with the second program pulse. This additional pulse can either be provided after the program pulse occurs (as depicted in FIGS. 7A-7C), or prior to the application of a program pulse (as depicted in FIGS. 7D-7F). These additional pulses comprise a net negative bias as measured from the gate region 720 to the drain region 710 of the memory device 700. But the magnitude of this additional pulse will generally be less than the magnitude of the program pulse.

As shown in FIGS. 7A-7C, the additional pulse can be provided after the second program pulse 740. The additional pulse is provided during time period $t_a$ and generally lasts for a period of 10 μs to 1 ms. According to one embodiment, the additional pulse may comprise a small positive bias 745 applied to the gate 720, such as about 1 volt, while applying a larger bias 746 to the drain 710, such as about 5 volts. Providing these biases produces a net negative bias of −4 v measured from the gate 720 to the drain 710 on the memory device 700. Acceptable biases for the first additional pulse include the ranges of $V_g$ from 0 volts to 3 volts and $V_d$ from 4 volts to 6 volts. Further, the duration of the first additional pulse can range anywhere from 10 μs to 1 ms. The magnitude of this additional pulse (e.g., −4 v) is less than the magnitude of the program pulse 740 (e.g., −15 v).

An alternative technique for providing the additional pulse is depicted in FIGS. 7D-7F. In FIGS. 7D-7F, the additional pulse is provided before the program pulse 740. The additional pulse is provided during time period $t_a$ and lasts for a period of about 10 μs to 1 ms. According to one embodiment, the additional pulse may comprise a small positive bias 747 applied to the gate 720, such as about 1 volt, while applying a larger bias 748 to the source 605, such as about 5 volts. Providing these biases produces a net negative bias measured from the gate 720 to the drain 710 on the memory device 700. Acceptable biases for the additional pulse include the ranges of $V_g$ from 0 volts to 3 volts and $V_d$ from 4 volts to 6 volts. Further, the duration of the additional pulse can range anywhere from 10 μs to 1 ms. The magnitude of this additional pulse (e.g., −4 v) is less than the magnitude of the program pulse 740 (e.g., −15 v). As mentioned previously, the additional pulse can be provided either before or after the program pulse 740 without departing from the scope of this invention.

Figure 8:
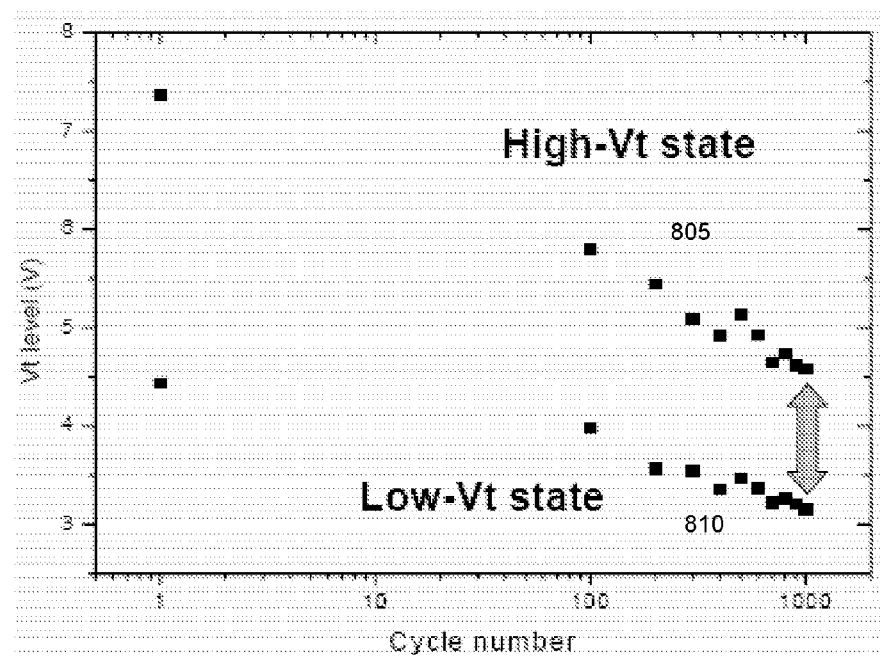
FIG. 8 is a chart depicting the long-term cycle performance of a PHINES memory device using conventional programming and erasing techniques.

A chart depicting the long-term cycle performance of a PHINES memory device using conventional programming and erasing techniques is depicted in FIG. 8. In FIG. 8, the threshold voltage $v_t$ of the memory device in the un-programmed state corresponds to the upper line of points 805 (i.e., the high-$v_t$ state) and the threshold voltage $v_t$ of the memory device in the programmed state corresponds to the lower line of points 810 (i.e., the low-$v_t$ state). As can be seen in the chart, the programmed and un-programmed threshold voltages of the memory device decay significantly with usage. Importantly, the operational range of the device (i.e., the distance between the programmed threshold voltage and the un-programmed threshold voltage) decays significantly with use from approximately 3 volts at the first cycle to approximately 1.5 volts at the $1000^{th}$ cycle.

Figure 9:
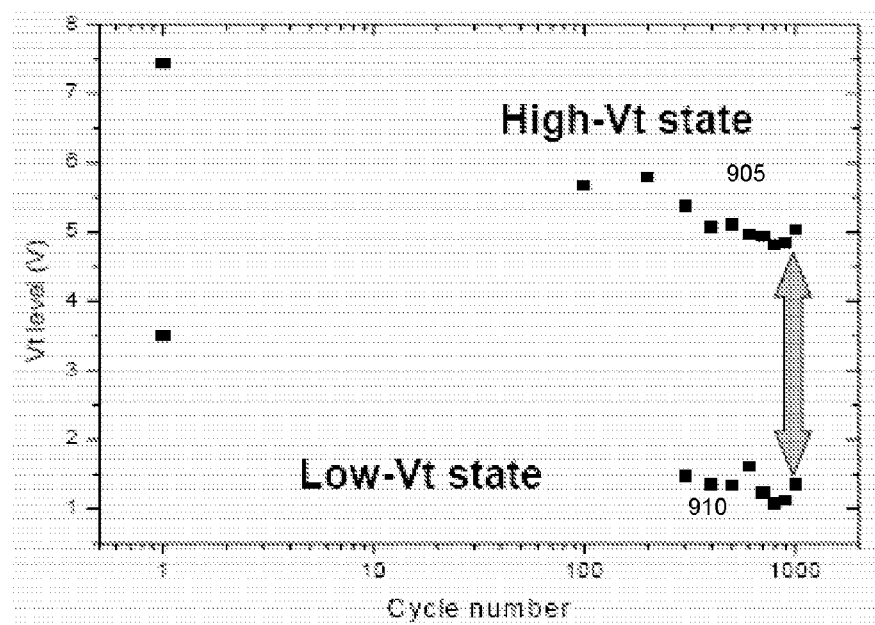
FIG. 9 is a chart depicting the long-term cycle performance of a PHINES memory device using additional pulses after the erase pulse.

A chart depicting the long-term cycle performance of a PHINES memory device using additional pulses after the erase pulse, as depicted and described in relation to FIGS. 5A-5C, is depicted in FIG. 9. In FIG. 9, the threshold voltage $v_t$ of the memory device in the un-programmed state corresponds to the upper line of points 905 (i.e., the high-$v_t$ state) and the threshold voltage $v_t$ of the memory device in the programmed state corresponds to the lower line of points 910 (i.e., the low-$v_t$ state). As can be seen in FIG. 9, the decay of the programmed and un-programmed threshold voltages over time is less pronounced with additional pulses after the erase pulse. In addition, the operational range of the device decays from about 4 volts at the first cycle to only about 3.5 volts at the $1000^{th}$ cycle, indicating a significant improvement over conventional techniques.

Figure 10:
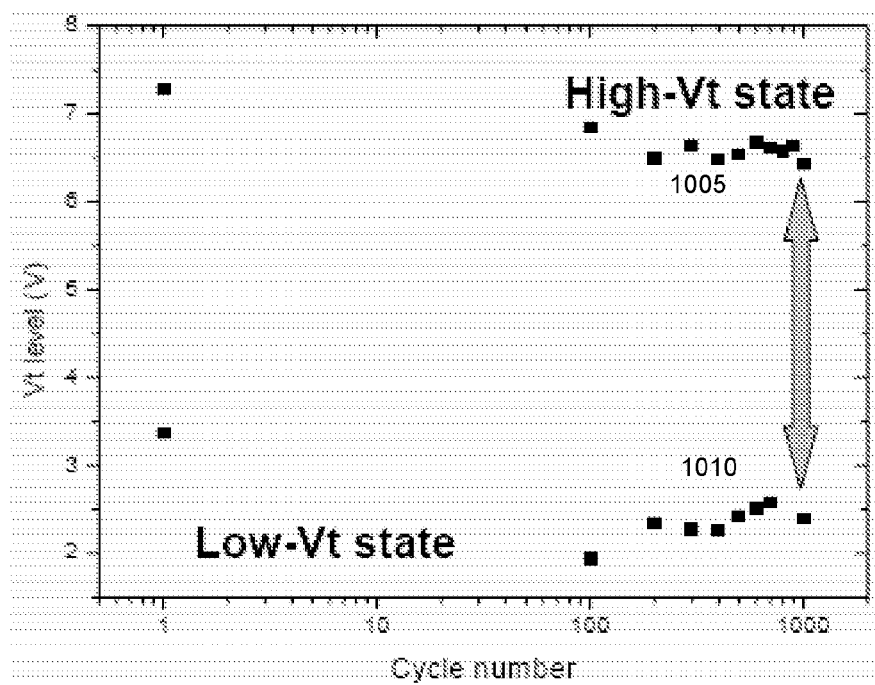
FIG. 10 is a chart depicting the long-term cycle performance of a PHINES memory device using additional pulses before the erase pulse.

A chart depicting the long-term cycle performance of a PHINES memory device using additional pulses before the erase pulse, as depicted and described in relation to FIGS. 5D-5F, is depicted in FIG. 10. In FIG. 10, the threshold voltage $v_t$ of the memory device in the un-programmed state corresponds to the upper line of points 1005 (i.e., the high-$v_t$ state) and the threshold voltage $v_t$ of the memory device in the programmed state corresponds to the lower line of points 1010 (i.e., the low-$v_t$ state). As can be seen in FIG. 10, the decay of the programmed and un-programmed threshold voltages over time is much less pronounced with additional pulses before the erase pulse. In addition, the operational range of the device shows almost no decay from the first cycle to the $1000^{th}$ cycle, indicating a significant improvement over conventional techniques.

Figure 11:
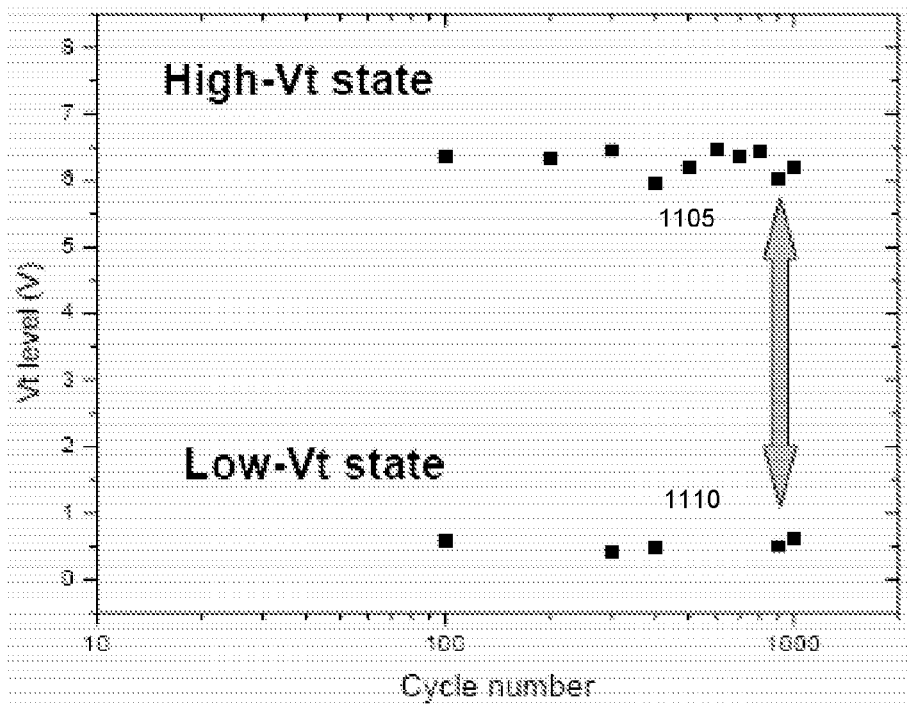
FIG. 11 is a chart depicting the long-term cycle performance of a PHINES memory device using an additional pulse after a programming pulse.

A chart depicting the long-term cycle performance of a PHINES memory device using additional pulses after the program pulse, as depicted in relation to FIGS. 6A-6C and 7A-7C, is depicted in FIG. 11. In FIG. 11, the threshold voltage $v_t$ of the memory device in the un-programmed state corresponds to the upper line of points 1105 (i.e., the high-$v_t$ state) and the threshold voltage $v_t$ of the memory device in the programmed state corresponds to the lower line of points 1110 (i.e., the low-$v_t$ state). As can be seen in FIG. 11, the decay of the programmed and un-programmed threshold voltages over time is much less pronounced with additional pulses after the program pulse. In addition, the operational range of the device shows almost no decay from the first cycle to the $1000^{th}$ cycle, indicating a significant improvement over conventional techniques.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A method for improving the cycle endurance of a memory device during a memory cell erase operation, comprising:

applying a first negative bias pulse to a gate of the memory device;

simultaneously applying a second positive bias pulse to the gate and a third positive bias pulse to a source of the memory device; and simultaneously applying a fourth positive bias pulse to the gate and a fifth positive bias pulse to a drain of the memory device after the simultaneous applying of the second and third positive bias pulses, wherein the duration and magnitude of each of the second, third, fourth, and fifth positive bias pulses are less than the duration and magnitude of the first negative bias pulse.

2. A method according to claim 1, wherein the second, third, fourth, and fifth positive bias pulses occur after the first negative bias pulse is applied to the memory device.

3. A method according to claim 1, the second, third, fourth, and fifth positive bias pulses occur before the first negative bias pulse is applied to the memory device.

4. A method according to claim 1, wherein the second positive bias pulse comprises a bias of about 1 volt applied to the gate of the memory device, the third positive bias pulse comprises a bias of about 5 volts applied to the source of the memory device, the fourth positive bias pulse comprises a bias of about 1 volt applied to the gate of the memory device, and the fifth positive bias pulse comprises a bias of about 5 volts applied to the drain of the memory device.

5. A method according to claim 4, wherein each of the second, third, fourth, and fifth positive bias pulses have a duration in the range of about 10 μs to about 1 ms.

6. A method according to claim 1, wherein the first negative bias pulse comprises a bias of about −20 volts applied to the gate of the memory device.

7. A method according to claim 6, wherein the first negative bias pulse has a duration in the range of about 1 ms to about 100 ms.

8. A method for improving the cycle endurance of a memory device during a memory cell programming operation, comprising:

simultaneously applying a first negative bias pulse to a gate of the memory device and a second positive bias pulse to a source of the memory device; and simultaneously applying a third positive bias pulse to the gate of the memory device and a fourth positive bias pulse to the source of the memory device, wherein the magnitude and duration of the third positive bias pulse is less than the magnitude and duration of the first negative bias pulse, and the magnitude and duration of the fourth positive bias pulse is less than the magnitude and duration of the second positive bias pulse.

9. A method according to claim 8, wherein the third and fourth positive bias pulses are applied after the first negative bias pulse and the second positive bias pulse are applied.

10. A method according to claim 8, wherein the third and fourth positive bias pulses are applied before the first negative bias pulse and the second positive bias pulse are applied.

11. A method according to claim 8, wherein the first negative bias pulse comprises a bias of about −10 volts applied to the gate of the memory device and the second positive bias pulse comprises a bias of about 5 volts applied to the source of the memory device.

12. A method according to claim 11, wherein the third positive bias pulse comprises a bias of about 1 volt applied to the gate of the memory device and the fourth positive bias pulse comprises a bias of about 5 volts applied to the source of the memory device.

13. A method according to claim 8, wherein the second positive bias pulse comprises a bias of about 5 volt applied to the source of the memory device, the third positive bias pulse comprises a bias of about 1 volts applied to the gate of the memory device, and the fourth positive bias pulse comprises a bias of about 5 volt applied to the source of the memory device.

14. A method according to claim 13, wherein each of the third and fourth positive bias pulses have a duration in the range of about 10 μs to about 1 ms.

15. A method according to claim 8, wherein the first negative bias pulse comprises a bias of about −10 volts applied to the gate of the memory device.

16. A method according to claim 15, wherein the first negative bias pulse and the second positive bias pulse each have a duration in the range of about 1 ms to about 100 ms.

17. A method for improving the cycle endurance of a memory device during a memory cell programming operation, comprising:

simultaneously applying a first negative bias pulse to a gate of the memory device and a second positive bias pulse to a drain of the memory device; and simultaneously applying a third positive bias pulse to the gate of the memory device and a fourth positive bias pulse to the drain of the memory device after the applying of the first negative bias pulse and the second positive bias pulse, wherein the magnitude and duration of each of the third and fourth positive bias pulses are less than the magnitude and duration of the first negative bias pulse and the second positive bias pulse.

18. A method according to claim 17, wherein the third and fourth positive bias pulses are applied after the first negative bias pulse and the second positive bias pulse are applied.

19. A method according to claim 17, wherein the third and fourth positive bias pulses are applied before the first negative bias pulse and the second positive bias pulse are applied.

20. A method according to claim 17, wherein the first negative bias pulse comprises a bias of about −10 volts applied to the gate of the memory device and the second positive bias pulse comprises a bias of about 5 volts applied to the drain of the memory device.

21. A method according to claim 20, wherein the third positive bias pulse comprises a bias of about 1 volt applied to the gate of the memory device and the fourth positive bias pulse comprises a bias of about 5 volts applied to the drain of the memory device.

22. A method according to claim 17, wherein the second positive bias pulse comprises a bias of about 5 volt applied to the drain of the memory device, the third positive bias pulse comprises a bias of about 1 volts applied to the gate of the memory device, and the fourth positive bias pulse comprises a bias of about 5 volt applied to the drain of the memory device.

23. A method according to claim 22, wherein each of the third and fourth positive bias pulses have a duration in the range of about 10 μs to about 1 ms.

24. A method according to claim 17, wherein the first negative bias pulse comprises a bias of about −10 volts applied to the gate of the memory device.

25. A method according to claim 24, wherein the first negative bias pulse has a duration in the range of about 1 ms to about 100 ms.

* * * * *